United States Patent [19]
Matsuoka

[11] Patent Number: 5,567,165
[45] Date of Patent: Oct. 22, 1996

[54] FLUID ACTUATED CONNECTOR/CARRIER FOR ELECTRIC PART

[75] Inventor: Noriyuki Matsuoka, Yokohama, Japan

[73] Assignee: Yamaichi Electronics Co., Ltd., Tokyo, Japan

[21] Appl. No.: 362,855

[22] Filed: Dec. 23, 1994

[30] Foreign Application Priority Data

Dec. 28, 1993 [JP] Japan .................................. 5-354670

[51] Int. Cl.$^6$ ................................................. B65D 73/02
[52] U.S. Cl. ........................... 439/42; 439/197; 174/52.4; 361/749
[58] Field of Search ....................... 439/41, 42, 196–198, 439/73, 526; 361/749, 820; 174/52.4

[56] References Cited

U.S. PATENT DOCUMENTS

| | | | |
|---|---|---|---|
| 3,596,228 | 7/1971 | Reed, Jr. .................................. | 439/197 |
| 4,744,009 | 5/1988 | Grabbe et al. ........................... | 361/749 |
| 4,780,086 | 10/1988 | Jenner et al. .............................. | 439/42 |
| 5,109,980 | 5/1992 | Matsuoka ................................. | 361/728 |

FOREIGN PATENT DOCUMENTS 1349786  4/1974  United Kingdom .

*Primary Examiner*—Neil Abrams
*Attorney, Agent, or Firm*—Wenderoth, Lind & Ponack

[57] ABSTRACT

A connector carrier for an electric part comprising a pressure reduction chamber (31b) having an opening portion, a flat first part arranged in such a manner as to allow one surface of the first part (wiring sheet 6) to contact the opening portion of the pressure reduction chamber and a second part (IC4) disposed within the pressure reduction chamber such that when the pressure reduction chamber is reduced in pressure, the first part (6) is urged toward the second part side (4) by a difference in air pressure, thereby allowing contact elements on both of the first and second parts to contact with each other. A pressure increasing chamber (42a) can be provided on a side of the first part opposite the second part so as to urge the first part toward the second part. The pressure increasing chamber and the pressure decreasing chamber can be utilized independently or in combination. Ports are provided to allow for the flow of gas into the pressure increasing chamber, the withdrawal of gas from the pressure reduction chamber and the flow of a gas, such as nitrogen or hydrogen, into the pressure reduction chamber. The connector/carrier is to be loaded into a socket (45) having electrical contacts (52).

18 Claims, 14 Drawing Sheets

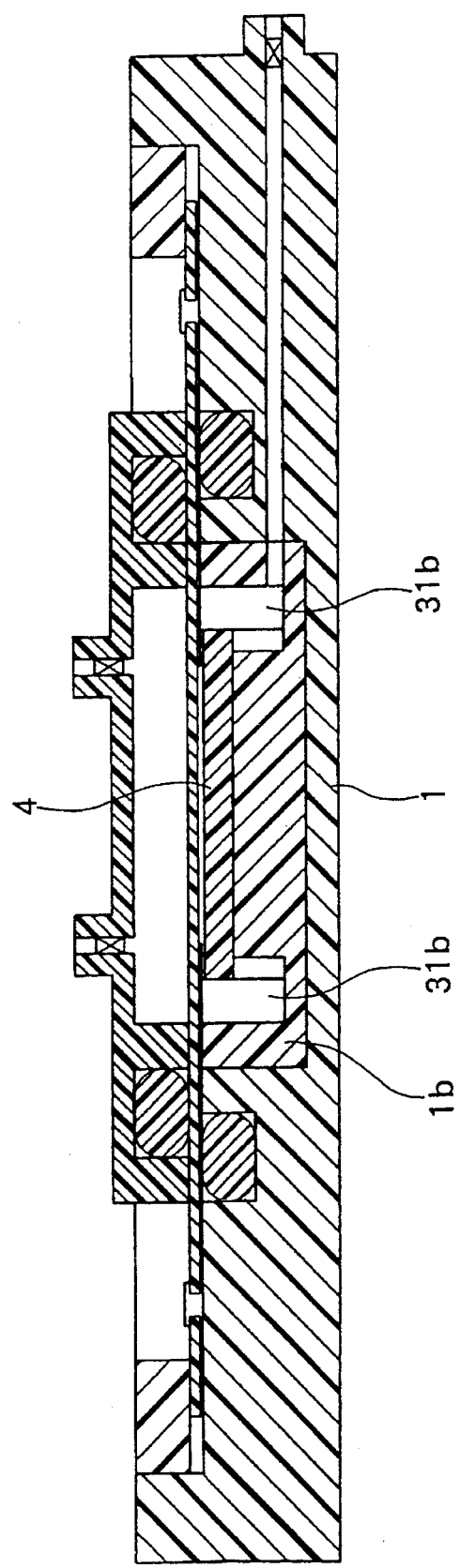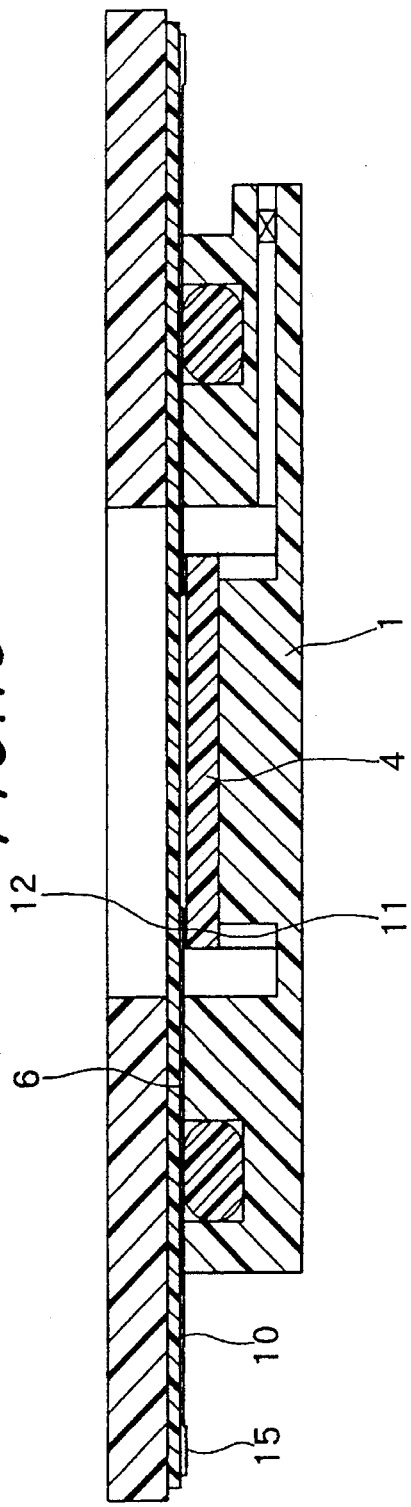

FLUID ACTUATED CONNECTOR/CARRIER FOR ELECTRIC PART

BACKGROUND OF THE INVENTION

This invention relates to a connector for an electric part, which is used for removably retaining a given electric part such as an IC, so as to be subjected to transportation, storage, or electrical connection with an IC socket, other electric parts, a wiring board, or the like for the supply and receipt of an electric current.

A given electric part such as, for example, an IC is frequently required to be subjected to an aging test. For this purpose, there is a need of a provision of means for enabling an electrical connection between the IC and a socket or testing device. As a conventional technique for uniformly contacting an IC having a plurality of contact elements which are arranged in array at very narrow pitches, there is known a method in which a carrier retaining an IC and a wiring sheet which is in a superimposed relation with the IC, is prepared, and the very narrow pitches, at which the IC contact elements are arranged, are widened by the use of a lead pattern of the wiring sheet, so that they can be reliably contacted with contacts of a socket.

Heretofore, a rubber having resilient properties has been used as means for contacting the contact elements of the IC and the contact elements of the flexible wiring sheet under pressure, and the rubber is disposed so as to be able to press a contacting line between the contact elements.

The pressing means is adapted to obtain a uniform pressing force utilizing the resilient properties of the rubber which can smoothly follow the flexure of the wiring sheet. However, if the pressing means is formed of a rubber, a problem arises in that when the rubber is repeatedly depressed for a long period of time, it is permanently deformed, thus making it difficult to maintain an appropriate pressure contacting force. This problem is more manifest when the IC is subjected to testing at a high temperature because the rubber is prone to thermal deterioration.

Also, in the case of a rubber, since the contacting portion is compressed by its surface load, the compressive force is unduly increased relative to the pressure contacting force, and this is one of the causes necessitating an increase in operating force.

SUMMARY OF THE INVENTION

It is, therefore, a general object of the present invention to provide a connector for an electric part which is capable of obviating the above-mentioned problems inherent in the prior art devices.

In order to achieve the above object, according to one aspect of the present invention, there is provided a connector for an electric part comprising a pressure reduction chamber having an opening portion, a flat first part arranged in such a manner as to allow one surface of the flat first part to contact the opening portion of the pressure reduction chamber and a second part disposed within the pressure reduction chamber such that when the pressure reduction chamber is reduced in pressure, the first part is urged toward the second part B side by a difference in air pressure, thereby allowing contact elements on both of the first and second parts to contact with each other.

According to another aspect of the invention, there is also provided a connector for an electric part comprising a pressure increasing chamber having an opening portion, a flat first part arranged in such a manner as to allow one surface of the first part to contact the opening portion of the pressure increasing chamber, and a second part disposed on the other surface side of the first part such that when the pressure increasing chamber is increased in pressure, the first part is urged toward the second part side by a difference in air pressure, thereby allowing contact elements on both of the first and second parts to contact with each other.

When the pressure in the pressure reduction chamber or pressure increasing chamber, which is adjacent to the contact elements of the IC body, is reduced or increased, a flat part such as a wiring sheet or the like, which is adjacent to an opening portion of the pressure reduction chamber or pressure increasing chamber is urged toward other parts such as the IC body, etc. due to a difference in air pressure, thereby enabling a reliable connection therebetween. Also, the nitrogen gas, or the like, which is charged into the pressure increasing chamber or pressure reduction chamber after the pressure therein has been reduced or increased, serves to prevent the surface of contact elements of an electric part from being changed by oxidizing, etc. due to atmospheric air in the chamber. Furthermore, by enclosing a certain gas, it becomes easy to transmit temperature to the IC.

According to the present invention, the problem of permanent deformation caused by compression, thermal deterioration, etc. as in the case with a rubber can be eliminated as much as possible, the favorable functions can be fully exhibited for a long period of time, and in addition, a need for the force for depressing the rubber can be entirely omitted.

The above and other objects, features and advantages of the present invention and the manner of realizing them will become more apparent, and the invention itself will best be understood from a study of the following description and appended claims with reference to the attached drawings showing some preferred embodiments of the invention.

Figure 4:
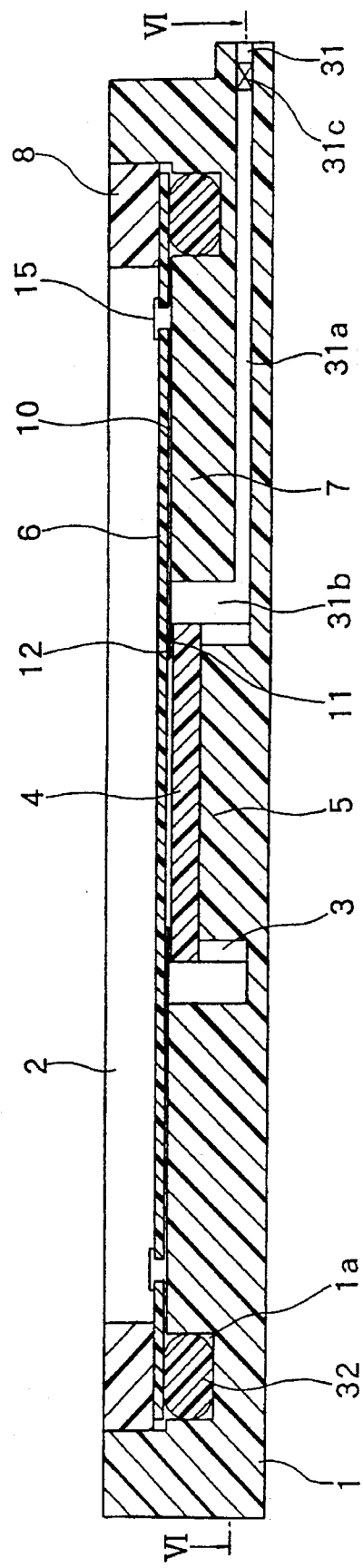
FIG. 4 is a side cross-sectional view of the first embodiment of the present invention.
Figure 5:
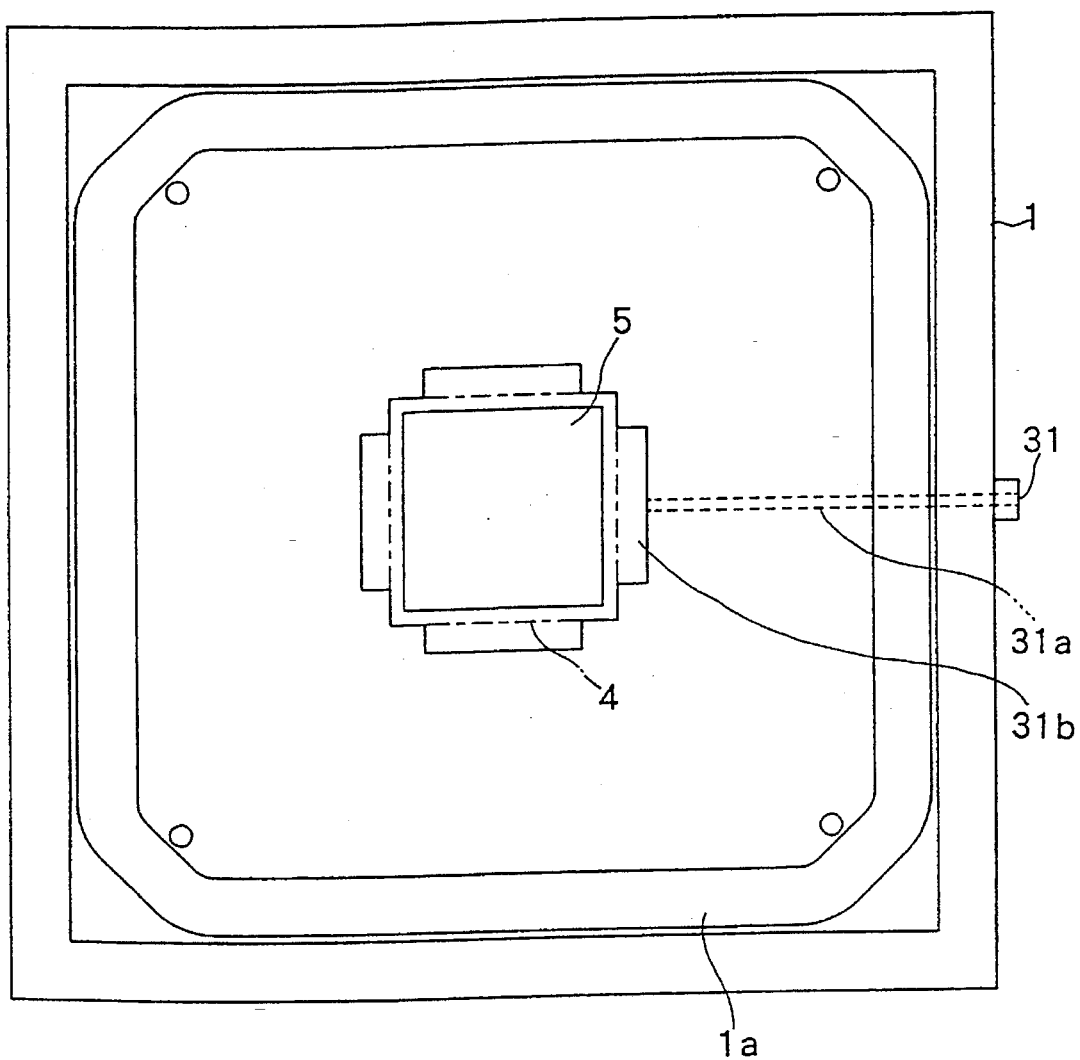
Figure 6:
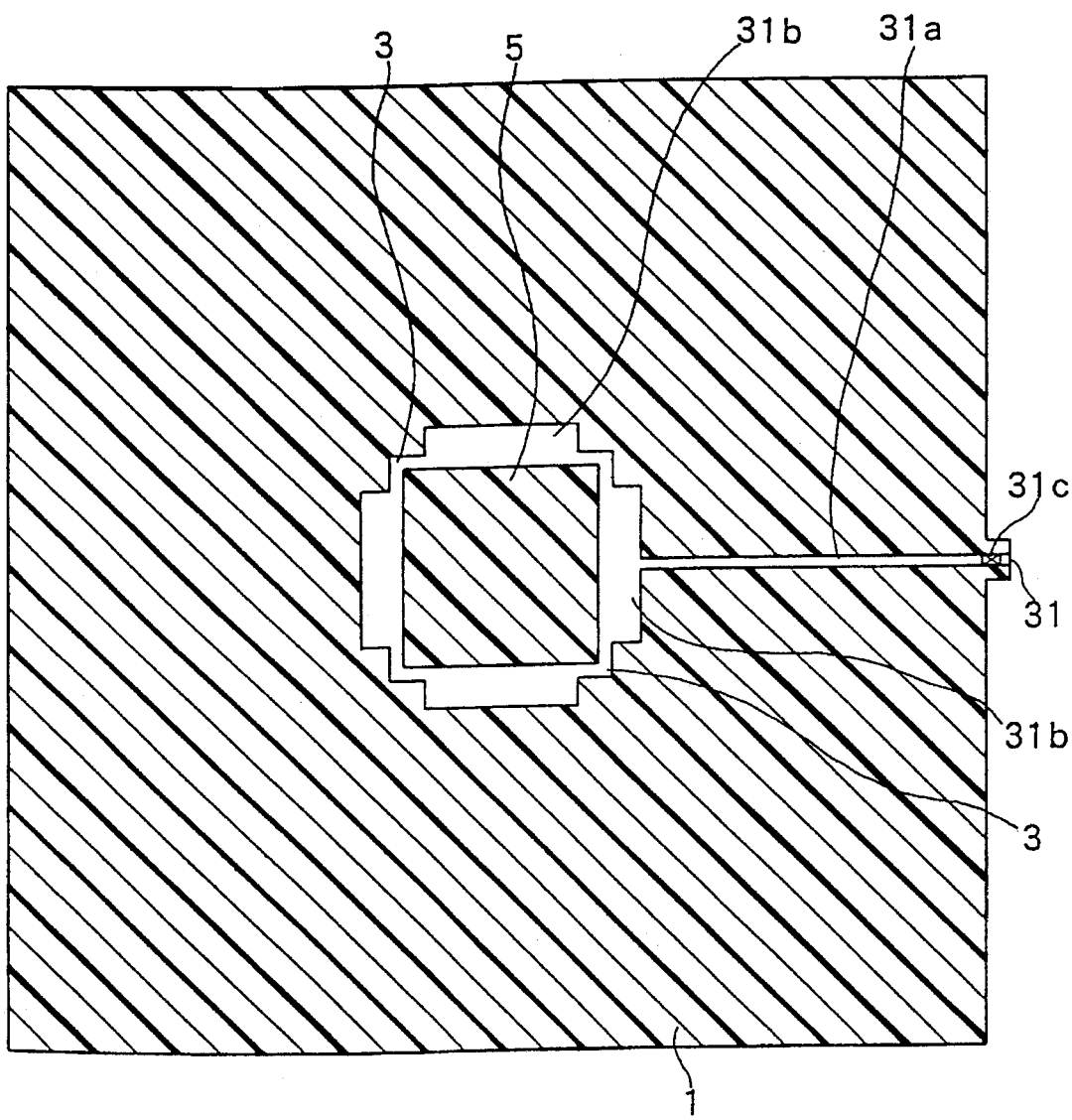
Figure 7:
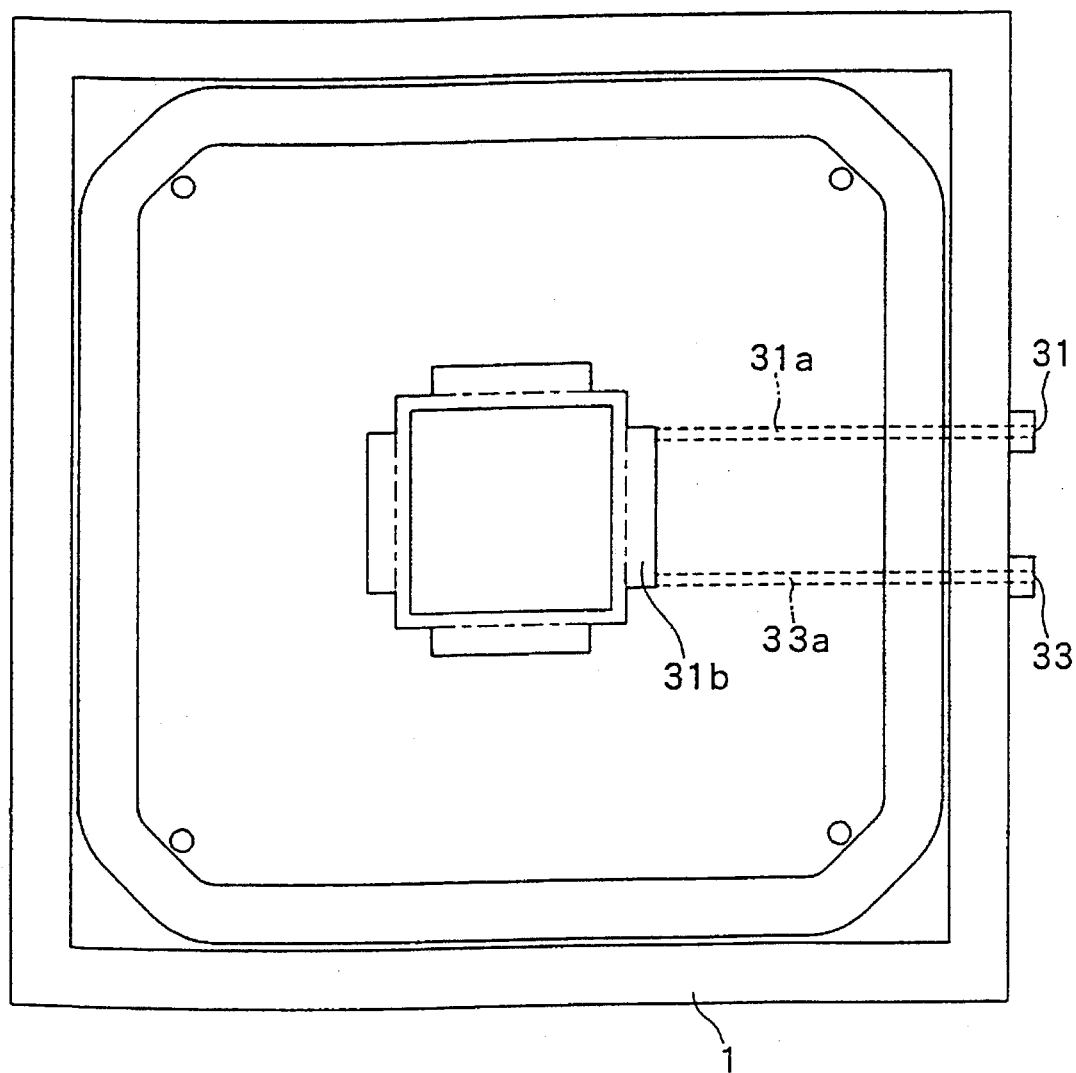
Figure 8:
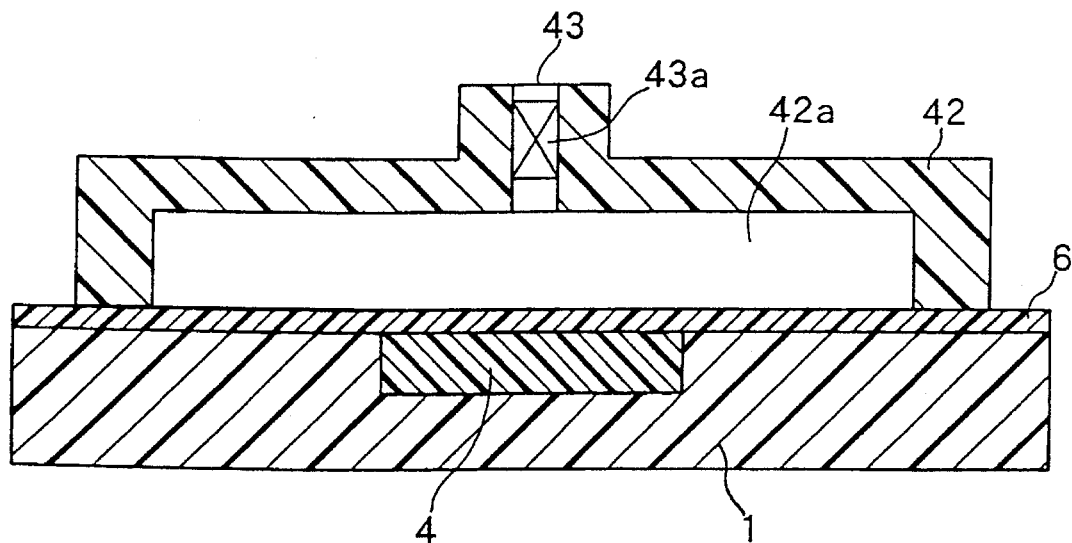
Figure 9:
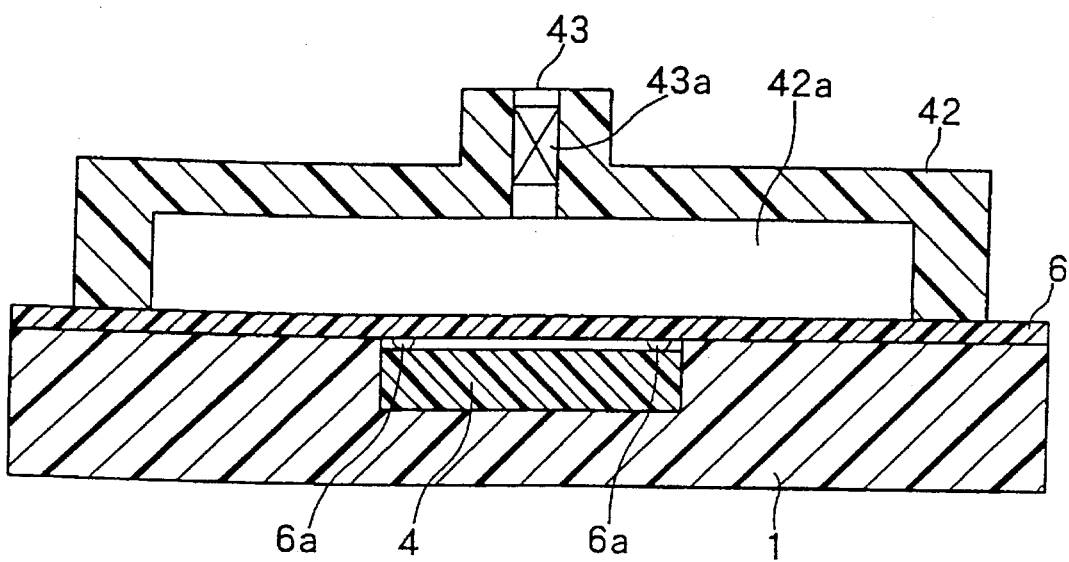
Figure 10:
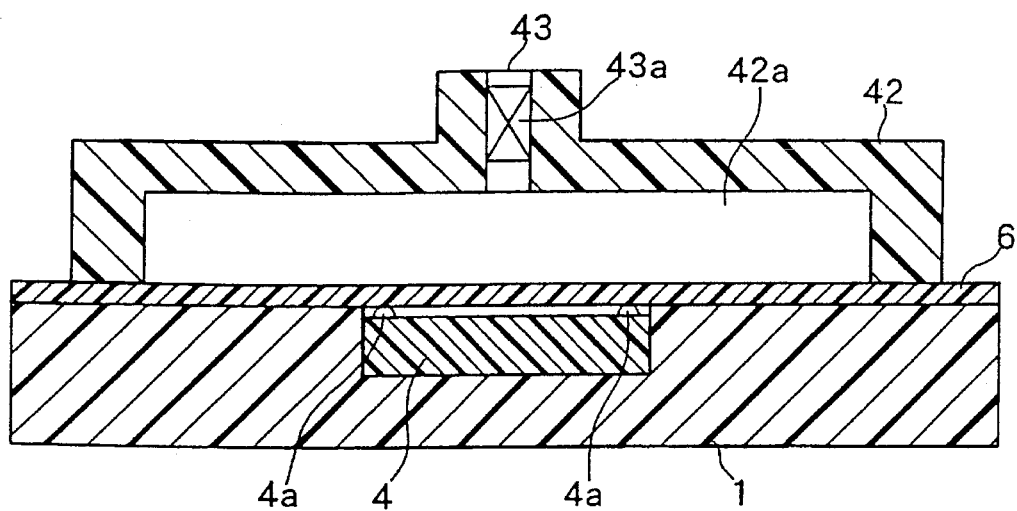
Figure 11:
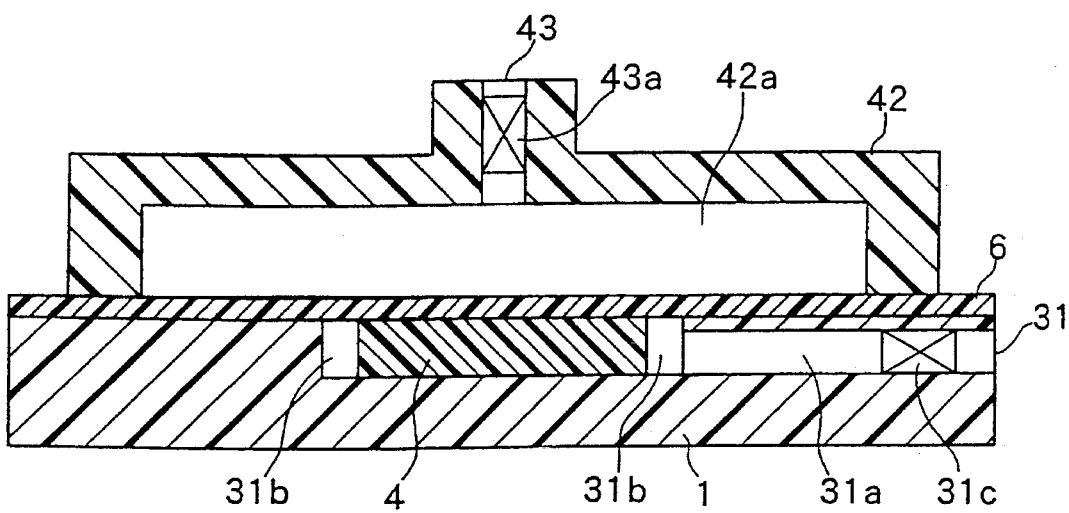
Figure 12:
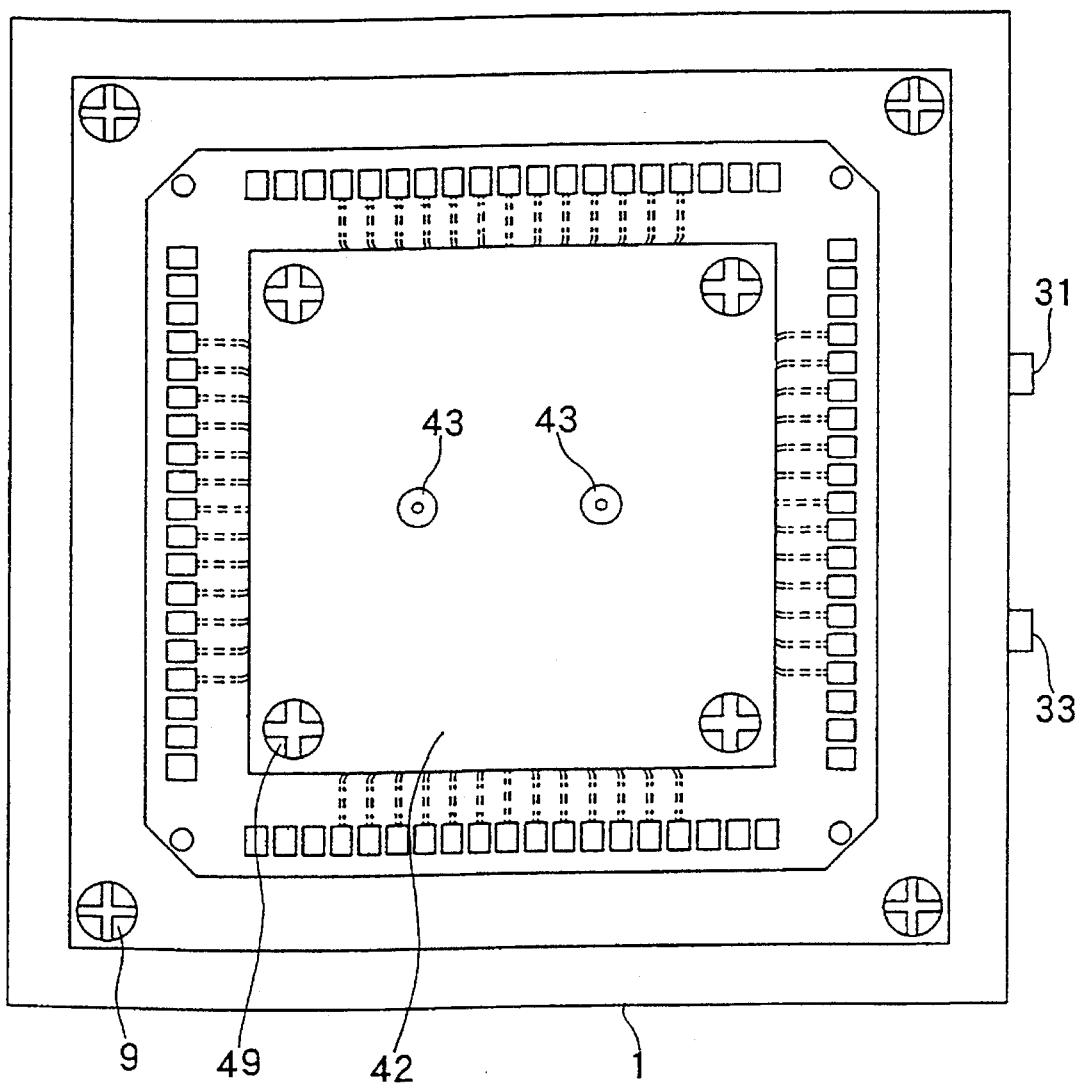
Figure 13:
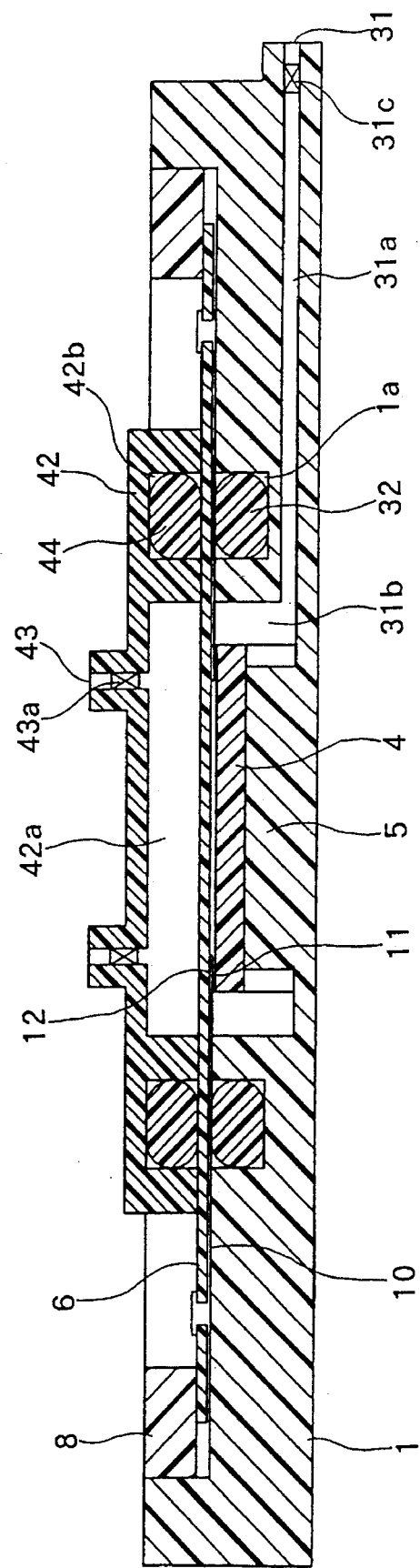
Figure 14:
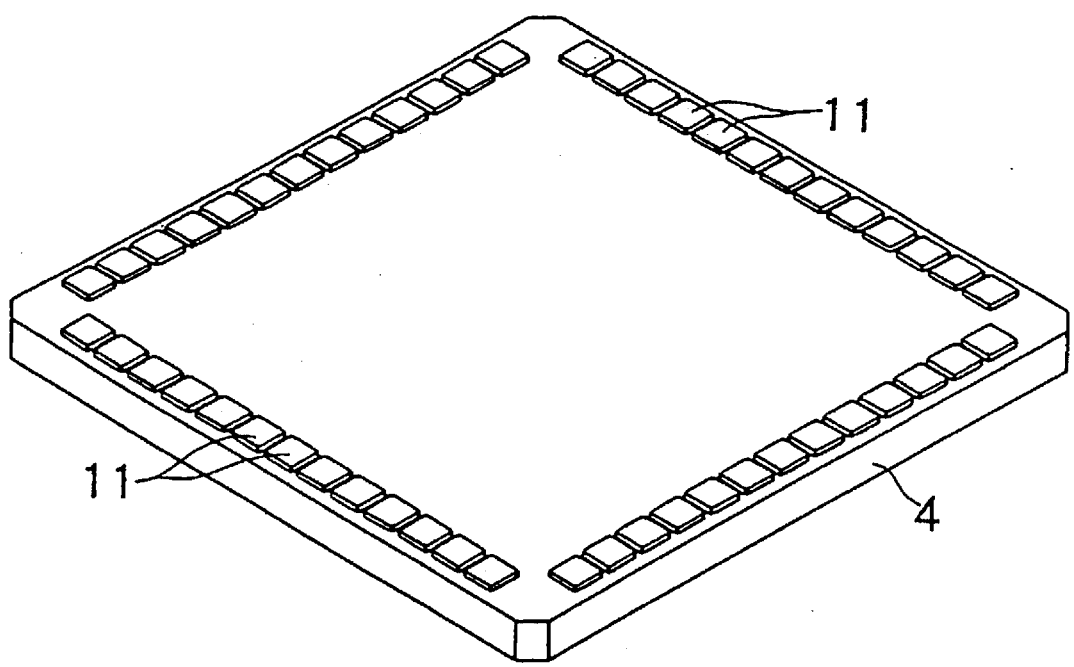
Figure 17:
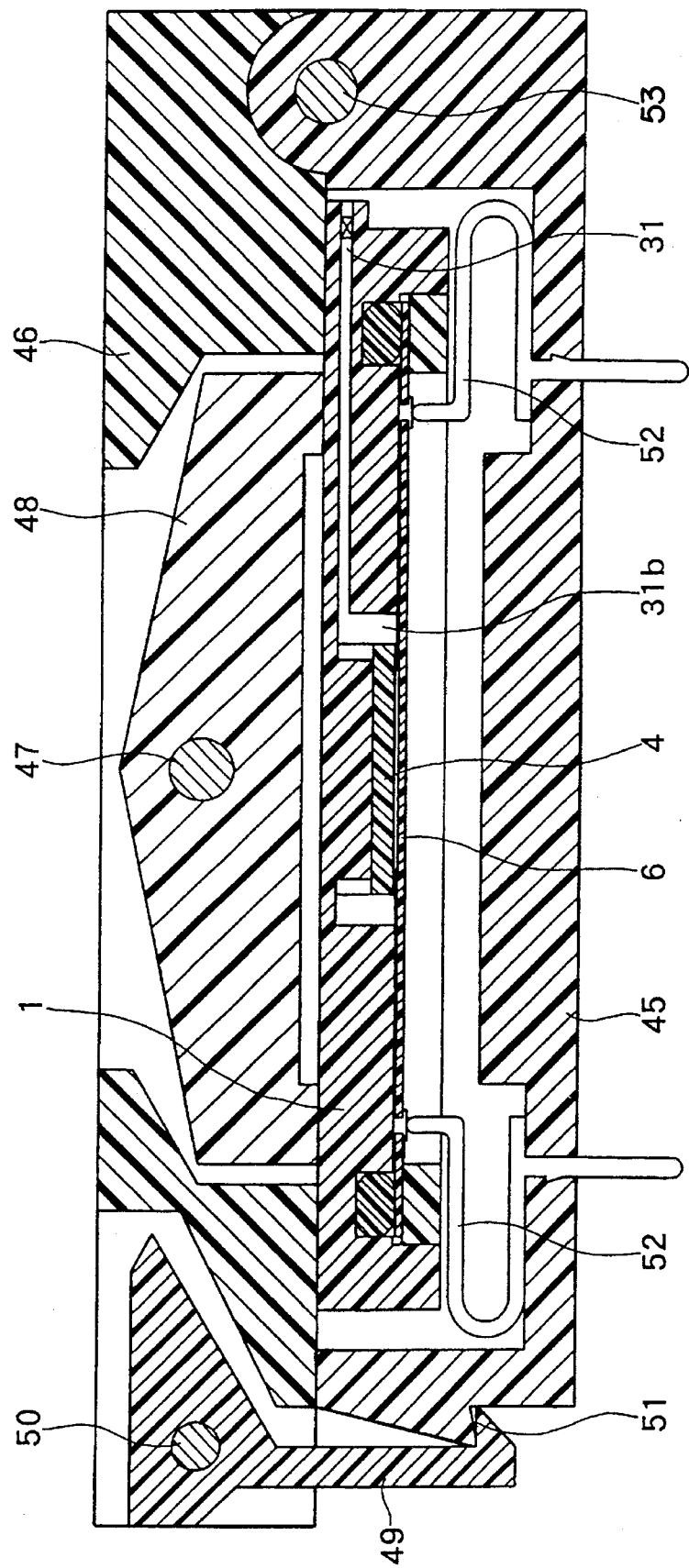

2FIG. 5 is a top view of the first embodiment, showing a state in which a wiring sheet is not yet mounted;

FIG. 6 is a cross-sectional view, taken on line VI—VI of FIG. 4, of the first embodiment of the present invention;

FIG. 7 is a top view of a connector according to a second embodiment of the present invention, showing a state in which a wiring sheet is not yet mounted;

FIG. 8 is a cross-sectional view of a connector for explaining an important portion of a third embodiment of the present invention;

FIG. 9 is a cross-sectional view of a connector for explaining an important portion of the third embodiment of the present invention;

FIG. 10 is a cross-sectional view of a connector for explaining an important portion of the third embodiment of the present invention;

FIG. 11 is a cross-sectional view of a connector for explaining an important portion of a fourth embodiment of the present invention;

FIG. 12 is a top view of the connector of the fourth embodiment of the present invention;

FIG. 13 is a side cross-sectional view of the connector of the fourth embodiment of the present invention;

FIG. 14 is a perspective view of an IC body;

FIG. 15 is a side cross-sectional view of a connector according to a modification of the fourth embodiment of the present invention;

FIG. 16 is a side cross-sectional view of a connector showing another example of a sealing structure for each of the above-mentioned embodiments of the present invention; and FIG. 17 is a side cross-sectional view showing a state in which a carrier is formed of a connector of the present invention, and this carrier is loaded on a socket.

DETAILED DESCRIPTION OF THE PREFERRED EMBODIMENTS

Some preferred embodiments will be described in great detail with reference to the accompanying drawings. However, it should be noted that the preferred embodiment herein described is not intended to be exhaustive or to limit the invention to the precise form disclosed. It is chosen and described to explain the principles of the invention, its application and its practical use to enable others skilled in the art to utilize the invention.

Figure 1:
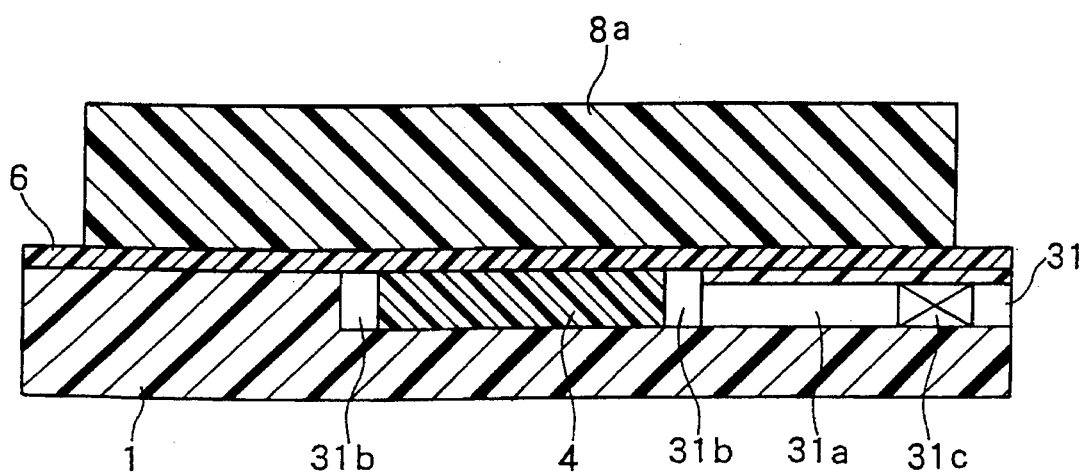
FIG. 1 is a cross-sectional view for explaining an important portion of a first embodiment in which an IC carrier is formed of a connector according to the present invention.

FIGS. 1 through 6 show a first embodiment of the present invention. FIG. 1 is an explanatory view of an important portion of the first embodiment. According to this first embodiment, an IC body 4 is placed in a recess portion which is exposed outside through an upper surface of a connector 1. A wiring sheet 6 is placed on the upper surface of the connector 1 and then a closure plate 8a is placed on the top of the wiring sheet 6, so that it can act as a temporary restriction means. Thereafter, an air pressure within pressure reduction chambers 31b formed around the IC body 4 is reduced through a pressure reduction port 31 formed in a side surface of the connector 1 via a valve 31c and a pressure reduction tube 31a, so that the wiring sheet 6 and an IC contact element portion can be reliably contacted with each other under uniform pressure. The embodiment will be more fully described with reference to FIGS. 2 through 6.

The connector 1 formed of an insulating material is of a flat square configuration and includes a sheet receiving portion 2 which is also square and exposed outside through an upper surface thereof. An IC receiving portion 3 is formed in a central area of an inner bottom surface of the sheet receiving portion 2. The IC body 4 is supported on a support seat 5 formed on an inner bottom surface of the IC receiving portion 3. The wiring sheet 6 is received in the sheet receiving portion 2 and supported on a support seat 7 which is formed on the bottom surface of the sheet receiving portion 2.

The IC body 4 supported on the support seat 5 is in contact with or adjacently opposite to the wiring sheet 6 supported on the support seat 7 at a central portion of the wiring sheet 6, and covered with the wiring sheet 6. Owing to this arrangement, the upper surface of the IC body 4 received in the IC receiving portion 3 is generally flush or coplanar with that of the support seat 7.

The IC body 4 and the wiring sheet 6, which are in superimposed relation, are assembled with the connector 1 as one unit. As means for assembling them, a frame 8, which has generally the same dimensions as the of the sheet receiving portion 2, is prepared and this frame 8 is fitted into an inner edge of the sheet receiving portion 2, with corner portions of the frame 8 secured to the connector 1 by suitable means such as screws 9. By securing the wiring sheet 6 to the support seat 7 of the connector 1, the IC body 4 is retained between the wiring sheet 6 and the support seat 5 of the connector 1.

As shown in FIG. 14, the IC body 4 is square in outer configuration and has a number of contact elements 11 arranged in array along an edge of the upper surface of the IC body 4. First contact pads 12 of the wiring sheet 6, which will be described hereinafter, are superimposed on the contact elements 11 for achieving electrical connection with leads 10.

The wiring sheet 6 is formed of a flexible insulating material such as, for example, synthetic resin film, and has a lead pattern corresponding to the contact elements 11 of the IC body 4 thereon. The wiring sheet 6 may be formed of a wiring board having a comparatively high rigidity.

Leads 10, which constitute the lead pattern, are intimately attached to the wiring sheet 6, for example, by printing, adhesive, or anchoring and allowed to extend radially toward a peripheral edge portion of the wiring sheet 6 from a central portion (area superimposed with the IC body 4) thereof; The leads 10 respectively have first contact pads 12, which are arranged at such narrow pitches as to be held opposite respectively to the contact elements 11 which are formed on the upper surface of the IC body 4, at their inner ends which terminate at the superimposed area. Also, the leads 10 respectively have second contact pads 15, which are arranged at such wide pitches as to be held opposite to the contacts provided on the a socket body shown in FIG. 17, at their outer ends which terminate at peripheral edge portion of the wiring sheet 6. That is, the lead pattern is subjected to electrical connection with the contacts, at the second contact pads 15 which are formed on outer ends thereof and widely spread over an outer area of the IC body 4. For example, the second contact pads 15 are arranged in array along an inner peripheral surface of the frame 8.

Figure 2:
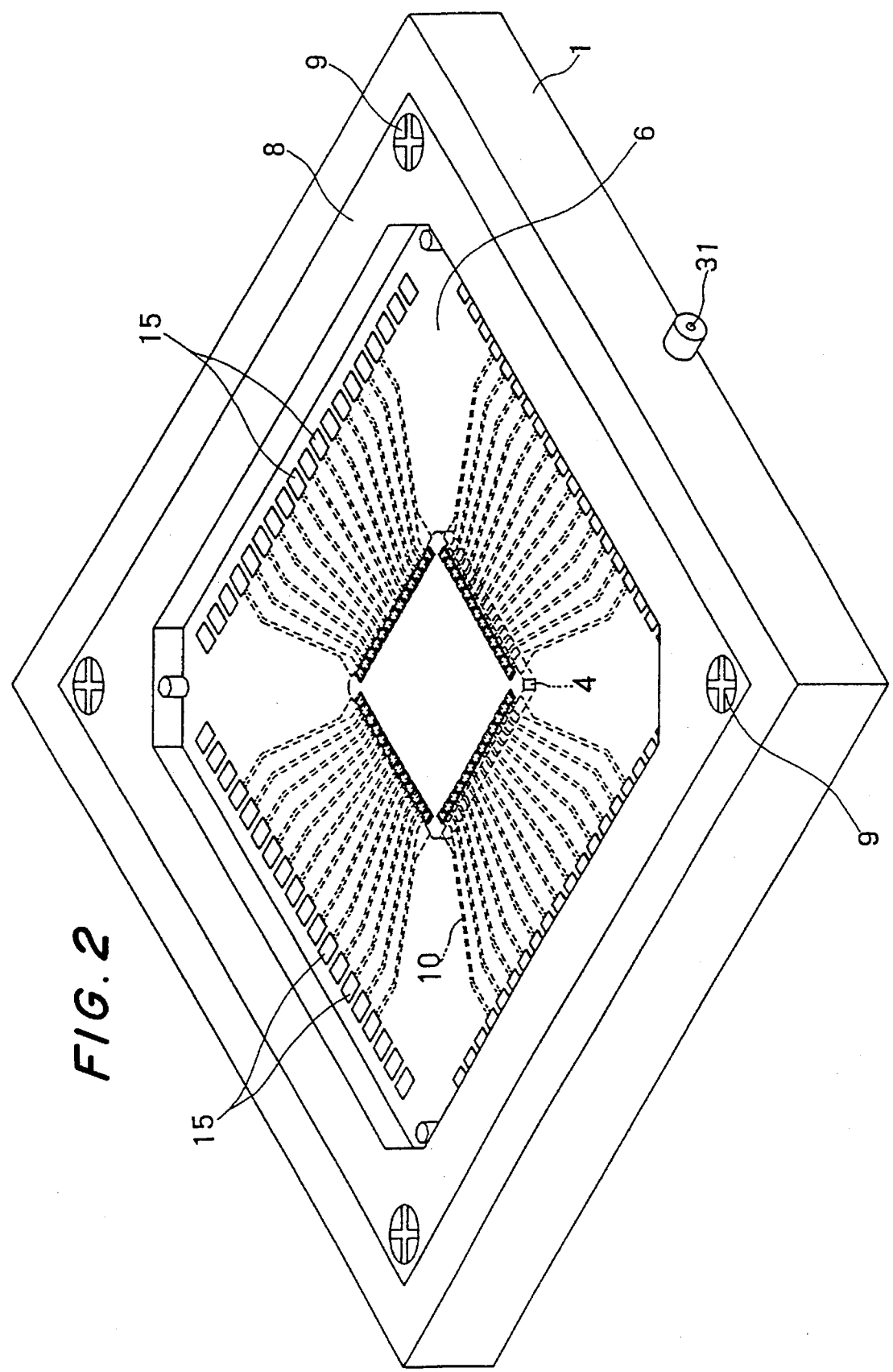
FIG. 2 is an overall perspective view of the first embodiment of the present invention.
Figure 3:
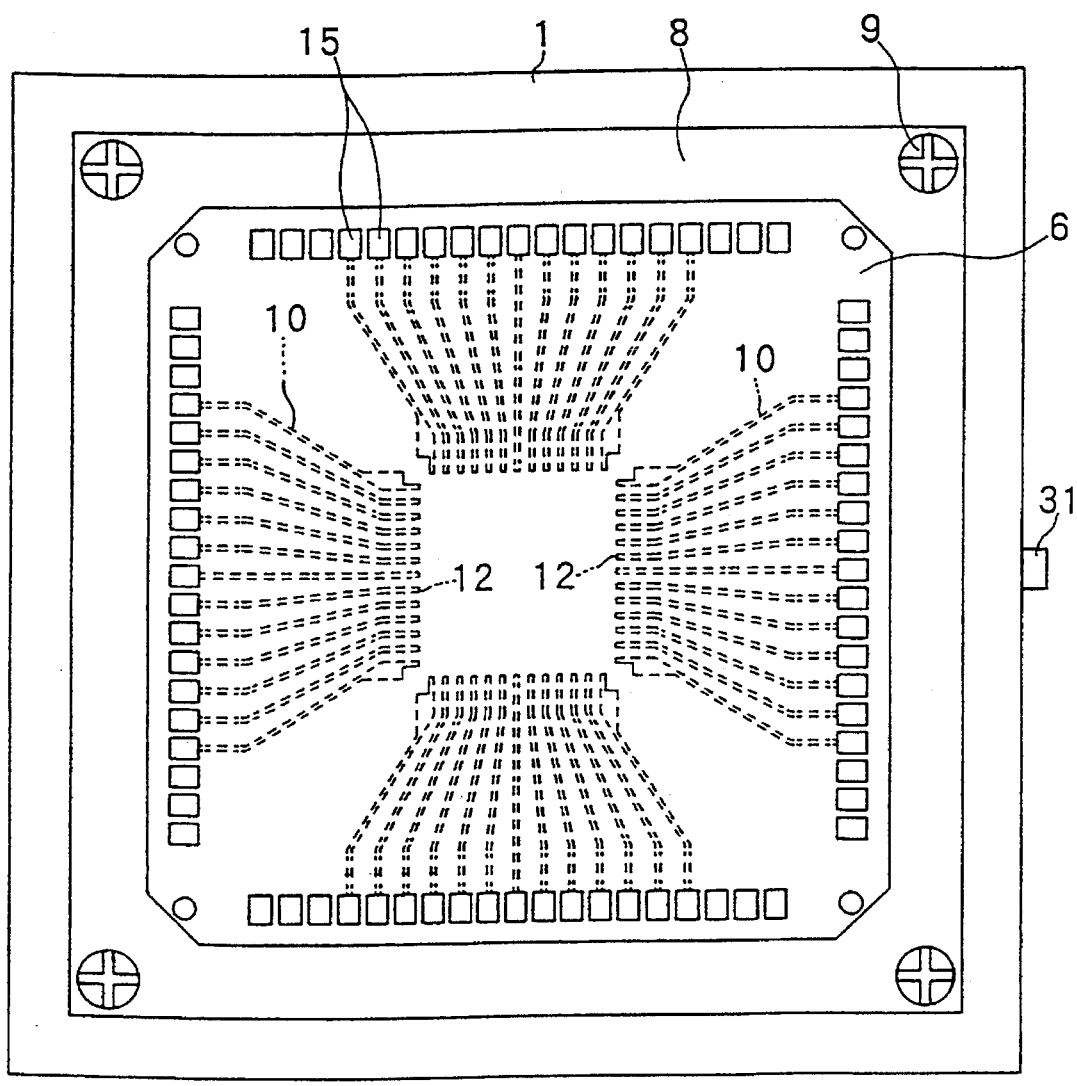
FIG. 3 is a top view of the first embodiment of the present invention.

The lead pattern is formed on the inner surface side of the wiring sheet 6 which is superimposed on the IC body 4 (as shown in FIGS. 2–4) or on the outer surface side thereof (not shown). The first contact pads 12 are arranged on the inner surface side of the wiring sheet 6 which is superimposed on the IC body 4. On the other hand, the second contact pads 15 are arranged in such a manner as to be exposed on the outer surface side of the wiring sheet 6 which is placed opposite to the contact.

Reference numeral 31 denotes the pressure reduction port. The pressure reduction port 31 is arranged in the center of a side surface of the connector 1 and connected to the pressure reduction chambers 31b via the pressure reduction tube 31a, within the connector 1. Each of the pressure reduction chambers 31b is a recess having a bottom, which is formed by partly expanding each edge portion of the generally square IC receiving portion 3 and which is continuous with the IC receiving portion 3. Above the pressure reduction chambers 31b, there is that part of each lead 10 which is in the vicinity of the first contact pad 12 when the wiring sheet 6 is loaded.

Under the frame 8 fitted to the connector 1, a groove 1a extending fully around the frame 8 is formed in the upper surface of the connector 1. A ring 32 formed of a resilient member such as a rubber and having a generally circular shape in section is fitted in the groove 1a. The wiring sheet 6 is held between the frame 8 and the ring 32. The ring 32 serves as a means for blocking communication between a gap continuous with the pressure reduction chambers 31b and a gap formed between the frame 8 and the sheet receiving portion 2.

With the above-mentioned construction, the IC body 4 is placed on the support seat 5 of the IC receiving portion 3, and the wiring sheet 6 is placed on the support seat 7 of the seat receiving portion 2. After the frame 8 is fitted to the connector 1 and firmly secured thereto by the screws 9, a pressure reduction means such as a discharge pump is mounted at the pressure reduction port 31. Then, the valve 31c is opened to reduce the air pressure within the pressure reduction chambers 31b to a predetermined level via the pressure reduction tube 31a.

FIG. 6 is a sectional view taken on line VI—VI of FIG. 4. As apparent from FIG. 6, the pressure reduction port 31c is continuous with one of the pressure reduction chambers 31b via the pressure reduction tube 31a and also with the remaining pressure reduction chambers 31b. Accordingly, a pressure reduction operation carried out at the pressure reduction port 31 is effective to reduce pressure in each of the pressure reduction chambers 31b. Therefore, the wiring sheet 6 contacting the pressure reduction chambers 31b is urged toward the pressure reduction chambers 31b side because of air pressure difference between the upper and lower surfaces of the wiring sheet 6. Since each pressure reduction chamber 31b is, as mentioned above, opposite to the parts of the leads 10 which are adjacent to the first contact pads 12 which are arranged at narrow pitches, the first contact pads 12 facing the contact elements 11 formed on the upper surface of the IC body 4 are positively contacted with the corresponding contact elements 11.

Since the wiring sheet 6 is subjected at its peripheral edge portion to depression by the frame 8 fitted to the connector 1 to compress the resilient ring 32 fitted in the groove 1a, thereby forming a means for blocking the communication between the gap continuous with the pressure reduction chambers 31b and the gap formed between the frame 8 and the sheet receiving portion 2, the above-mentioned pressure reduction function is not adversely affected.

Since the pressure reduction is instantaneously made, the action for superimposing the wiring sheet 6 on the IC body 4 is also instantaneously made. Accordingly, it does not occur that the first contact pads 12 and the IC contact elements 11 are positionally displaced during the assembling operation.

Next, other embodiments of the present invention will be described with reference to FIGS. 7–17. For convenience of explanation, those parts which have basically like functions are denoted by like reference numerals irrespective of slight difference in construction.

FIG. 7 is a second embodiment similar to the above-mentioned first embodiment, showing a connector 1 on which a wiring sheet 6, a frame 8 and screws 9 are not yet mounted. In this embodiment, the connector 1 is provided with a pressure reduction tube 31a and an inlet tube 33a leading to the pressure reduction chamber 31b. The pressure reduction tube 31a and the inlet tube 33a respectively include a pressure reduction port 31 and an inlet port 33 which are provided on an outer surface of the connector 1.

As in the case of the first embodiment, after the pressure is reduced through the pressure reduction port 31, a valve 31c disposed at the pressure reduction port 31 is closed and a predetermined amount of gas such as nitrogen, hydrogen, or the like is charged through the inlet port 33. Then, a valve not shown is closed. By storing and transporting the connector 1 with the IC in that state, surfaces of those portions of the component parts which contact the atmospheric air in the pressure reduction chambers 31b can be prevented from being oxidized and changed in state.

By enclosing a certain gas, the temperature of the IC can be increased to a predetermined level during the aging test of the IC.

FIGS. 8 to 10 are explanatory views of an important portion of the third embodiment of the present invention. In FIG. 8, an IC body 4 is received in a recess which is exposed outside through an upper surface of the connector 1, a wiring sheet 6 closing the open top of the recess is placed on the upper surface of the connector 1 and then, a pressure increasing member 42 including a pressure increasing chamber 42a is placed on the top of the wiring sheet 6. After the pressure increasing member 42 is firmly secured to the connector 1 by screws or the like, the air pressure within the pressure increasing chamber 42a is increased through a pressure increasing port 43 formed in an upper part of the pressure increasing member 42 via a valve 43a, so that the wiring sheet 6 and the IC contact element portion are positively contacted by a uniform pressure.

FIGS. 9 and 10 correspond to FIG. 8. In an embodiment of FIG. 9, bumps 6a are formed on first contact pads 12 of a wiring sheet 6, and in an embodiment of FIG. 10, bumps 4a are formed on contact elements of an IC body 4. Owing to a provision of those bumps 6a and 4a, a favorable contact can be obtained between the wiring sheet 6 and the IC as a result of the pressure increase.

FIG. 11 is an explanatory view of an important portion of a fourth embodiment of the present invention. In FIG. 11, an IC body 4 is received in a recess of a connector 1, a wiring sheet 6 closing an open top of the recess is placed on the upper surface of the connector 1 and then, a pressure increasing member 42 including a pressure increasing chamber 42a is placed on the top of the wiring sheet 6. Thereafter, the air pressure within the pressure increasing chamber 42a is increased through a pressure increasing port 43 formed in an upper part of the pressure increasing member 42 via a valve 43a and the air pressure within pressure reduction chambers 31b formed around the IC body 4 is reduced through a pressure reduction port 31 formed at a side surface of the connector 1, so that the wiring sheet 6 and the IC contact element portion are positively contacted by a uniform pressure. The embodiment will be described in more detail with reference to FIGS. 12 and 13.

FIG. 12 is a top plan view of the connector 1, and FIG. 13 is a sectional view thereof. In these Figures, although the construction of the connector 1 body side is generally the same to that of the first embodiment, a difference resides in that the location of a groove 1a in which a ring 32 is fitted is placed opposite to another ring on a pressure increasing member side as will be described later.

Reference numeral 42 denotes the above-mentioned pressure increasing member which is of a flat and square configuration. Two pressure increasing ports 43 are formed in the upper surface of the pressure increasing member 42 and continuous with a square pressure increasing chamber 42a formed in a lower surface side thereof via a valve 43a. A groove 42b extending all the way around the lower surface of the pressure increasing member 42 is formed at an outer periphery of the pressure increasing chamber 42a. A ring 44 formed of a resilient material and having a generally circular shape in section is fitted in the groove 42b. After mounted, the pressure increasing member 42 is secured to the connector 1 with its four corners fastened by screws or the like, as shown in FIG. 12.

The air pressure within the pressure increasing chamber 42a is increased through the two pressure increasing ports 43 formed in the upper part of the pressure increasing member 42 via the valve 43a, and the air pressure within the pressure reduction chamber 31b formed around the IC body 4 is reduced through the pressure reduction port 31 formed in a side surface of the connector 1 via the valve 31c and the pressure reduction tube 31a. Owing to the synergistic effect of the pressure increase and pressure decrease, those parts of the leads 10 of the wiring sheet 6 which are adjacent to the first contact pads 12 which are arranged at narrow pitches are pressed by a uniform force, the first contact pads 12 facing the contact elements 11 formed on the upper surface of the IC body 4 are positively contacted with the corresponding contact elements 11 for realizing a reliable electrical connection therebetween.

Since both the pressure increasing chamber 42a and pressure reduction chamber 31b are closed by the resilient rings 32 and 44, the effects of pressure reduction and pressure increase are not adversely affected.

Although only the procedures for reducing the pressure through the pressure reduction port 31 and increasing the pressure through the pressure increasing port 43 have been described, another procedure may be employed in which, as shown in FIGS. 7 and 12, the connector 1 is provided with an introduction tube 33a including an inlet port 33 continuous with the pressure reduction chamber 31b of the connector 1, and after the pressure is reduced through the pressure reduction port 31, the valve 31c installed at the pressure reduction port 31 is closed, and then after a predetermined amount of gas such as nitrogen, hydrogen, or the like is charged through the inlet port 33, a valve (not shown) is closed. By storing and transporting the connector 1 with the IC in that state, surfaces of those portions of the component parts which contacts the atmospheric air in the pressure reduction chambers 31b can be prevented from being oxidized, and the like.

Also, by enclosing a certain gas, the temperature of the IC can be increased to a predetermined level during the aging test of the IC.

Also, by charging a predetermined amount of gas such as nitrogen, hydrogen, or the like instead of simply air through the pressure increasing port 43, those parts of the upper surface of the component parts, which contact the atmospheric air in the pressure increasing chamber 42a on the upper surface side of the wiring sheet 6, can be prevented from being oxidized and changed in state.

It is acceptable that after the pressure is decreased or a vacuum state is formed by removing air from the pressure increasing chamber, a selected one of the above-specified gasses is charged into the pressure increasing chamber in order to increase pressure therein.

FIG. 15 is a modified example of the fourth embodiment. In this modified example, a square portion including the support seat for supporting the IC body of the connector 1 body and the pressure reduction chambers is formed of an inner housing 1b separately situated, and then fitted into the connector 1 body.

In an example of FIG. 16, a lead pattern of a wiring sheet 6 is formed on an inner or outer surface of the wiring sheet 6 which is in superimposed relation with the IC body 4, first contact pads 12 are formed on the inner surface of the wiring sheet 6 which is in superimposed relation with the IC body 4, and second contact pads 15 are also formed on the inner surface of the wiring sheet 6 which is in superimposed relation with the IC body 4. Accordingly, this exemplified device is suited to be used for a socket of the type in which contacts are provided on the opposite side.

The above respective embodiments constitute IC connectors which are to be loaded in a socket of FIG. 17. The IC may be replaced by an IC package, or other electric parts.

As described above, the IC 4 and the wiring sheet 6, which are in superimposed relation, are integrally assembled with a substrate 1 which constitutes a carrier, and the contact members of the IC 4 and wiring sheet 6 are intimately contacted by the pressure reduction or pressure increase mentioned above. The socket 45 is provided at one end thereof with a pressing cover 46 which is rotatably supported by a pin 53 so that the pressing cover 46 can move between an open position and a closed position. The pressing cover 46 is also provided with a pressing pad 48 which is rotatably supported by a pin 47, so that the pressing pad 48 presses the upper surface of the carrier 1.

Reference numeral 49 denotes a lock portion. The lock portion 49 is rotatably supported on one end portion of the pressing cover 46 through a pin 50, so that the lock portion 49 is engaged with a step portion 51 of the socket 45 to lock the pressing cover 46 in its closed position. In that state, the pressing pad 48 depresses the upper surface of the substrate 1 to press the second contact pads 15 of the wiring sheet 6 against the contacts 52 retained by the socket 45. This socket 45 is placed on a wiring board and subjected to an aging test of an IC.

As described in the foregoing, according to the present invention, a connector for an electric part such as an IC carrier is provided with either or both of a pressure reduction chamber and a pressure increasing chamber, and electric connection between given parts is obtained utilizing a pressure imparted to the parts due to a difference in air pressure between the inside and outside of the chamber or chambers. Accordingly, a uniform pressure can be applied to a predetermined surface, the parts are not positionally displaced during assembly, and a favorable electrical connection can be obtained. Also, by charging a nitrogen gas or the like into either or both of the pressure reduction chamber and the pressure increasing chamber, the surface of the contacting area, etc. can be prevented from being changed by oxidizing or the like during transportation and storage. Moreover, the temperature of the IC can be increased to a predetermined level by charging a gas at the time the IC is subjected to the aging test.

According to the present invention, the problem of permanent deformation caused by compression, thermal deterioration, etc. as in the case with a rubber can be eliminated as much as possible, the favorable functions can be fully exhibited for a long period of time, and in addition, the need for force for depressing the rubber can be entirely omitted.

It is to be understood that the forms of the invention disclosed herein are to be taken as the preferred embodiments thereof, and that various changes in the shape, size, and arrangement of parts as well as various procedural changes may be resorted to without departing from the spirit of the invention or the scope of the appended claims.

What is claimed is:

1. An apparatus comprising:
   a connector body having an IC receiving portion at a central portion thereof for receiving an IC having IC terminals, and a wiring sheet receiving seat disposed about said IC receiving portion, said IC receiving portion having an opening which opens in a first direction;

a wiring sheet mounted on said wiring sheet receiving seat so as to cover said opening of said IC receiving portion, said IC receiving portion covered by said wiring sheet defining a pressure reduction chamber;

wherein said wiring sheet comprises a flexible sheet having first contact pads at an inner portion thereof, second contact pads at an outer portion thereof and conductive leads extending generally radially between said first contact pads and said second contact pads, respectively; and wherein a pressure reduction passage opens into said pressure reduction chamber for allowing gas to be drawn out of said pressure reduction chamber to cause said wiring sheet to flex in a second direction, opposite said first direction, toward said IC receiving portion so as to cause mutual contact between one of said first and second contact pads and the IC terminals, respectively, when the IC is received in said IC receiving portion of said connector body.

2. An apparatus as recited in claim 1, further comprising an IC receiving seat disposed in said IC receiving portion of said connector body, said IC receiving seat facing in said first direction.

3. An apparatus as recited in claim 2, wherein said IC receiving seat is offset in said second direction from said wiring sheet receiving seat.

4. An apparatus as recited in claim 1, wherein said wiring sheet receiving seat has a groove formed therein surrounding said IC receiving portion; and an elastomeric ring is mounted in said groove.

5. An apparatus as recited in claim 1, wherein an inlet passage opens into said pressure reduction chamber for allowing a gas body to be fed into said pressure reduction chamber to cause a surface of the IC when disposed in said IC receiving portion to be exposed to an environment of the gas body.

6. An apparatus as recited in claim 1, further comprising a pressure increasing member mounted atop said wiring sheet, said pressure increasing member having a recess opening in said second direction and facing said wiring sheet, such that said wiring sheet closes said recess and such that said recess and said wiring sheet define therebetween a pressure increasing chamber; and wherein a pressure increasing passage opens into said pressure increasing chamber for allowing gas to be fed into said pressure increasing chamber to increase the pressure therein and cause said wiring sheet to flex in said second direction toward the IC when the IC is received in said IC receiving portion.

7. An apparatus comprising:

a connector body having an IC receiving portion at a central portion thereof for receiving an IC having IC terminals, and a wiring sheet receiving seat disposed about said IC receiving portion, said IC receiving portion having an opening which opens in a first direction;

a wiring sheet mounted on said wiring sheet receiving seat so as to cover said opening of said IC receiving portion;

a pressure increasing member mounted atop said wiring sheet, said pressure increasing member having a recess opening in said second direction and facing said wiring sheet, such that said wiring sheet closes said recess and such that said recess and said wiring sheet define therebetween a pressure increasing chamber;

wherein said wiring sheet comprises a flexible sheet having first contact pads at an inner portion thereof, second contact pads at an outer portion thereof and conductive leads extending generally radially between said first contact pads and said second contact pads, respectively; and wherein a pressure increasing passage opens into said pressure increasing chamber for allowing gas to be fed into said pressure increasing chamber to increase the pressure therein and cause said wiring sheet to flex in said second direction toward the IC when the IC is received in said IC receiving portion.

8. An apparatus as recited in claim 7, further comprising an IC receiving seat disposed in said IC receiving portion of said connector body, said IC receiving seat facing in said first direction.

9. An apparatus as recited in claim 8, wherein said IC receiving seat is offset in said second direction from said wiring sheet receiving seat.

10. An apparatus as recited in claim 7, wherein said pressure increasing member has a groove formed therein surrounding said recess; and an elastomeric ring is mounted in said groove.

11. An apparatus comprising:

a connector body having an upwardly facing wiring sheet receiving seat, and an upwardly opening IC receiving recess formed at a central portion thereof for receiving an IC having IC terminals;

an upwardly facing IC receiving seat disposed in said IC receiving recess and being disposed below said wiring sheet receiving seat;

a flexible wiring sheet mounted on said wiring sheet receiving seat so as to span across and cover said IC receiving recess, said IC receiving recess covered by said wiring sheet defining a pressure reduction chamber;

wherein a pressure reduction passage opens into said pressure reduction chamber for allowing gas to be drawn out of said pressure reduction chamber to cause said wiring sheet to flex downwardly into said IC receiving recess so as to cause mutual contact between said wiring sheet and the IC when the IC is received in said IC receiving recess of said connector body.

12. An apparatus as recited in claim 11, wherein said wiring sheet comprises a flexible sheet having first contact pads at an inner portion thereof, second contact pads at an outer portion thereof and conductive leads extending generally radially between said first contact pads and said second contact pads, respectively.

13. An apparatus as recited in claim 11, wherein said wiring sheet receiving seat has a groove formed therein surrounding said IC receiving recess; and an elastomeric ring is mounted in said groove.

14. An apparatus as recited in claim 11, wherein an inlet passage opens into said pressure reduction chamber for allowing a gas body to be fed into said pressure reduction chamber to cause a surface of the IC when disposed in said IC receiving recess to be exposed to an environment of the gas body.

15. An apparatus as recited in claim 11, further comprising a pressure increasing member mounted atop said wiring sheet, said pressure increasing member having a downwardly opening recess facing said wiring sheet, such that said wiring sheet closes said downwardly opening recess and such that said downwardly opening recess and said wiring sheet define therebetween a pressure increasing chamber; and wherein a pressure increasing passage opens into said pressure increasing chamber for allowing gas to be fed into said pressure increasing chamber to increase the pressure therein and cause said wiring sheet to flex downwardly into said IC receiving recess to contact the IC when the IC is received in said IC receiving recess.

16. An apparatus comprising:

a connector body having an upwardly facing wiring sheet receiving seat, and an upwardly opening IC receiving recess formed at a central portion thereof for receiving an IC having IC terminals;

an upwardly facing IC receiving seat disposed in said IC receiving recess and being disposed below said wiring sheet receiving seat;

a flexible wiring sheet mounted on said wiring sheet receiving seat so as to span across and cover said IC receiving recess;

a pressure increasing member mounted atop said wiring sheet, said pressure increasing member having a downwardly opening recess facing said wiring sheet, such that said wiring sheet closes said downwardly opening recess and such that said downwardly opening recess and said wiring sheet define therebetween a pressure increasing chamber;

wherein a pressure increasing passage opens into said pressure increasing chamber for allowing gas to be fed into said pressure increasing chamber to increase the pressure therein and cause said wiring sheet to flex downwardly into said IC receiving recess when the IC is received in said IC receiving recess.

17. An apparatus as recited in claim 16, wherein said wiring sheet comprises a flexible sheet having first contact pads at an inner portion thereof, second contact pads at an outer portion thereof and conductive leads extending generally radially between said first contact pads and said second contact pads, respectively.

18. An apparatus as recited in claim 16, wherein said pressure increasing member has a groove formed therein surrounding said downwardly opening recess; and an elastomeric ring is mounted in said groove.

* * * * *